US 8,124,963 B2

(12) United States Patent
Suh et al.

(10) Patent No.: US 8,124,963 B2
(45) Date of Patent: Feb. 28, 2012

(54) THIN FILM TRANSISTOR, METHOD OF FABRICATING THE THIN FILM TRANSISTOR, ORGANIC LIGHT EMITTING DIODE DISPLAY DEVICE, METHOD OF FABRICATING THE ORGANIC LIGHT EMITTING DIODE DISPLAY DEVICE, AND DONOR SUBSTRATE FOR LASER INDUCED THERMAL IMAGING

(75) Inventors: Min-Chul Suh, Suwon-si (KR); Seong-Taek Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 274 days.

(21) Appl. No.: 12/207,025

(22) Filed: Sep. 9, 2008

(65) Prior Publication Data

US 2009/0072229 A1    Mar. 19, 2009

(30) Foreign Application Priority Data

Sep. 14, 2007   (KR) ................... 10-2007-0093539

(51) Int. Cl.
*H01L 35/24* (2006.01)
*H01L 21/00* (2006.01)
*H01L 21/84* (2006.01)
*H01L 29/10* (2006.01)
(52) U.S. Cl. ....... 257/40; 257/66; 257/88; 257/E51.017; 257/E21.002
(58) Field of Classification Search .................... 257/40, 257/E51.017, 211
See application file for complete search history.

(56) References Cited

U.S. PATENT DOCUMENTS

| | | | | |
|---|---|---|---|---|
| 5,837,374 | A * | 11/1998 | Hirayama et al. | 428/408 |
| 6,852,582 | B2 | 2/2005 | Wei et al. | |
| 7,511,296 | B2 * | 3/2009 | Nakayama et al. | 257/40 |
| 2004/0106718 | A1 * | 6/2004 | Krohn | 524/444 |
| 2004/0256980 | A1 * | 12/2004 | Tsuchiya | 313/503 |
| 2005/0110929 | A1 | 5/2005 | Nakajima et al. | |
| 2006/0119259 | A1 | 6/2006 | Bae et al. | |
| 2006/0220542 | A1 * | 10/2006 | Suh et al. | 313/506 |
| 2007/0063205 | A1 * | 3/2007 | Kang et al. | 257/88 |
| 2007/0096079 | A1 * | 5/2007 | Nakayama et al. | 257/40 |
| 2007/0126352 | A1 * | 6/2007 | Okutani | 313/506 |
| 2007/0221958 | A1 * | 9/2007 | Aoki | 257/211 |

(Continued)

FOREIGN PATENT DOCUMENTS

JP         11-214161         8/1999

(Continued)

OTHER PUBLICATIONS

Korean Notice of Allowance issued Oct. 22, 2009, in corresponding Korean Patent Application No. 10-2007-0093539.

(Continued)

*Primary Examiner* — Jerome Jackson, Jr.
*Assistant Examiner* — David Spalla
(74) *Attorney, Agent, or Firm* — Robert E. Bushnell, Esq.

(57) ABSTRACT

A thin film transistor (TFT), a method of fabricating the TFT, an organic light emitting diode (OLED) display device, a method of fabricating the OLED display device, and a donor substrate for laser induced thermal imaging (LITI) includes interconnections formed of a mixed layer of metal nanoparticles and carbon black using a laser induced thermal imaging (LITI) technique.

11 Claims, 6 Drawing Sheets

U.S. PATENT DOCUMENTS

| | | | |
|---|---|---|---|
| 2009/0186490 A1* | 7/2009 | Nakayama et al. | 438/780 |
| 2009/0230861 A1* | 9/2009 | Miyazaki et al. | 313/582 |
| 2009/0236977 A1* | 9/2009 | Suh et al. | 313/504 |
| 2009/0243111 A1* | 10/2009 | Ishikawa et al. | 257/762 |

FOREIGN PATENT DOCUMENTS

| | | |
|---|---|---|
| JP | 2005-115326 | 4/2005 |
| JP | 2006-351543 | 12/2006 |
| KR | 10-2004-0103373 | 12/2004 |
| KR | 2005-48705 | 5/2005 |
| KR | 10-2006-0062619 | 6/2006 |
| KR | 2006-76868 | 7/2006 |
| KR | 10-2006-0113745 | 11/2006 |
| KR | 10-2006-0132396 | 12/2006 |
| KR | 10-0707775 | 4/2007 |

OTHER PUBLICATIONS

Office Action issued in Korean Patent Application No. 10-2007-0093539 on Jul. 21, 2009.

English abstract for Korean Patent Publication No. 1020050080439, Aug. 12, 2005.

* cited by examiner

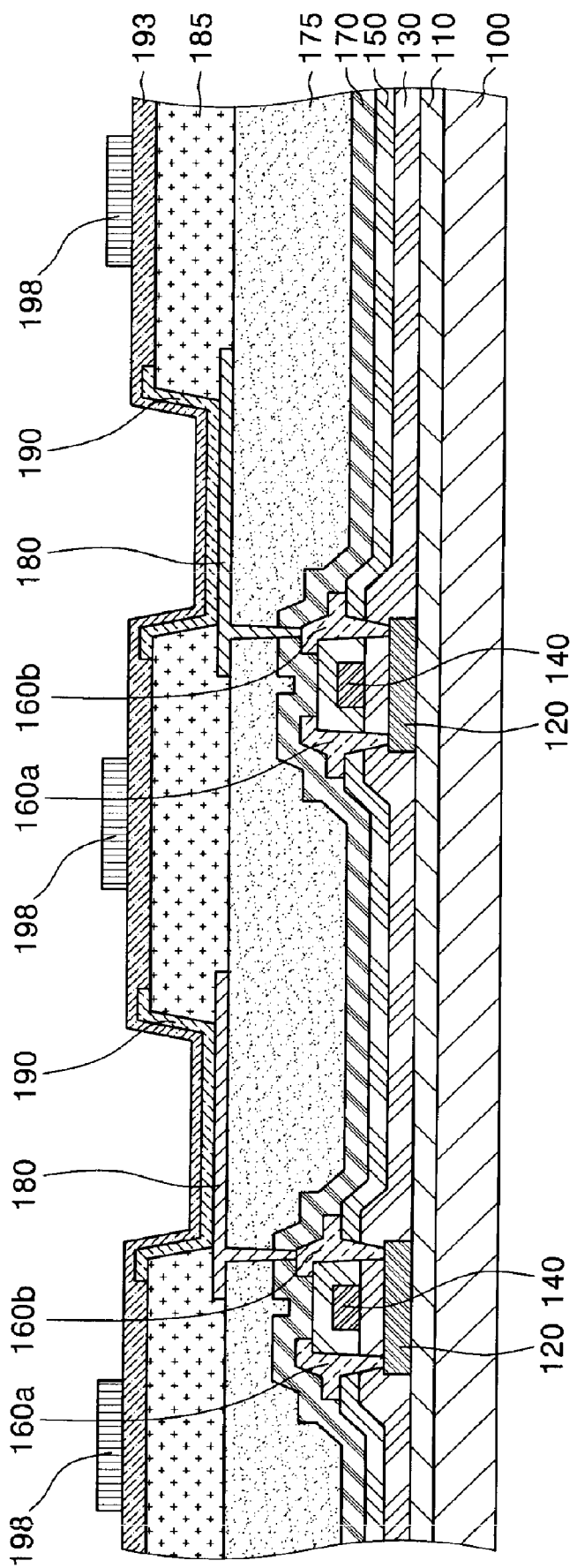

THIN FILM TRANSISTOR, METHOD OF FABRICATING THE THIN FILM TRANSISTOR, ORGANIC LIGHT EMITTING DIODE DISPLAY DEVICE, METHOD OF FABRICATING THE ORGANIC LIGHT EMITTING DIODE DISPLAY DEVICE, AND DONOR SUBSTRATE FOR LASER INDUCED THERMAL IMAGING

CROSS-REFERENCE TO RELATED APPLICATION

This application claims the benefit of Korean Application No. 2007-93539, filed Sep. 14, 2007, in the Korean Intellectual Property Office, the disclosure of which is incorporated herein by reference.

BACKGROUND OF THE INVENTION

1. Field of the Invention

Aspects of the present invention relate to an organic light emitting diode (OLED) display device, a method of fabricating the same, and a donor substrate for laser induced thermal imaging (LITI) and, more particularly, to a method of fabricating an interconnection formed of metal nanoparticles and carbon black using a laser induced thermal imaging (LITI) technique.

2. Description of the Related Art

In the current information-oriented society settings, the role of electronic display devices is becoming more important, and a variety of the electronic display devices are used widely. The electronic display devices may be classified into an emissive display device, in which an optical information signal is used to display an image on the electronic display devices using an electroluminescent phenomenon, and a non-emissive display device, in which light modulation is used to display an image on the electronic display devices using reflection, scattering, and interference of light. The emissive display devices, which are also referred to as active display devices, may include cathode ray tubes (CRTs), plasma display panels (PDPs), light emitting diodes (LEDs), and organic light emitting diode (OLED) display devices. Also, the non-emissive display devices, which are also referred to as passive display devices, may include liquid crystal displays (LCDs) and electrophoretic image displays (EPIDs).

Among flat panel display devices (FPDs), OLED display devices can be made thin and lightweight, and they require less power and lower driving voltages than other types of display devices. Also, since the OLED display devices are capable of displaying images at similar or better quality level than the CRTs, they are being broadly used for various electronic devices.

However, as active-matrix OLED (AMOLED) display devices are scaled up, interconnections used to transmit and receive electric signals between respective components of AMOLED display devices are lengthened, resistances thereof are increased, and signal delays are generated. Also, an IR (or voltage) drop occurs therein, so that luminance becomes nonuniform in a pixel region of the AMOLED. As a result, power consumption increases, so the AMOLED display devices may not be suitable for use in mobile display devices.

Furthermore, typical interconnections are formed by depositing or sputtering a material used for the interconnections. However, the process of depositing or sputtering the material is complicated and may damage other components of the AMOLED. Therefore, it is necessary to develop new methods of fabricating an OLED display device, such as the AMOLED display devices, in which interconnections are better formed to reduce failures of the devices and to improve luminance thereof.

SUMMARY OF THE INVENTION

Aspects of the present invention include a thin film transistor (TFT) in which an electrode or an interconnection formed of an organic carbide and a metal nanoparticle is formed on a substrate, an organic light emitting diode (OLED) display device having the interconnection, and a method of fabricating the same.

Aspects of the present invention also includes a method of forming an electrode or an interconnection using a laser induced thermal imaging (LITI) technique to reduce resistance therein, thereby reducing pixel failures.

According to an aspect of the present invention, a TFT and a method of fabricating the TFT are shown. The TFT includes: a substrate; a buffer layer disposed on the substrate; a semiconductor layer disposed on the buffer layer; a gate electrode disposed over the semiconductor layer; a gate insulating layer formed between the gate electrode and the semiconductor layer to electrically insulate the semiconductor layer from the gate electrode; source and drain electrodes electrically connected to the semiconductor layer; and an interlayer insulating layer formed between the gate electrode and the source and drain electrodes to electrically insulate the gate electrode from the source and drain electrodes. The gate electrode and/or each of the source and drain electrodes may be formed of an organic carbide and a metal nanoparticle.

According to another aspect of the present invention, an OLED display device and a method of fabricating the same are provided. The OLED display device includes: a substrate; a buffer layer disposed on the substrate; a semiconductor layer disposed on the buffer layer; a gate electrode disposed over the semiconductor layer and electrically insulated from the semiconductor layer; a gate insulating layer formed between the gate electrode and the semiconductor layer to electrically insulate the semiconductor layer from the gate electrode; source and drain electrodes electrically insulated from the gate electrode and connected to the semiconductor layer; an interlayer insulating layer formed between the gate electrode and the source and drain electrodes to electrically insulate the gate electrode from the source and drain electrodes; a passivation layer disposed on an entire surface of the substrate; a planarization layer disposed on the passivation layer; a first electrode disposed on the planarization layer and connected to the source and drain electrodes; a pixel defining layer disposed on the first electrode and exposing a portion of the first electrode; an organic emission layer disposed on a pixel region on the exposed first electrode; and a second electrode disposed over the entire surface of the substrate. The gate electrode, the source and drain electrodes, the first electrode, and/or the second electrode are formed of an organic carbide and a metal nanoparticle.

According to still another aspect of the present invention, a donor substrate for LITI is provided. The donor substrate includes: a base substrate; a light-to-heat conversion (LHC) layer disposed on the base substrate; and a mixed layer of an organic material and a metal nanoparticle disposed on the LHC layer.

According to an aspect of the present invention, a method of fabricating a thin film transistor (TFT) over a prepared substrate includes forming the TFT including a semiconductor layer, a gate insulating layer, a gate electrode, and source and drain electrodes, wherein the gate electrode and/or each of the source and drain electrodes is formed from a mixed layer of an organic material and a metal nanoparticle, which is then sintered.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIGS. 1A through 1E are cross-sectional views illustrating a method of fabricating an organic light emitting diode (OLED) display device according to an aspect of the present invention.

DETAILED DESCRIPTION OF THE EMBODIMENTS

Figure 1A:
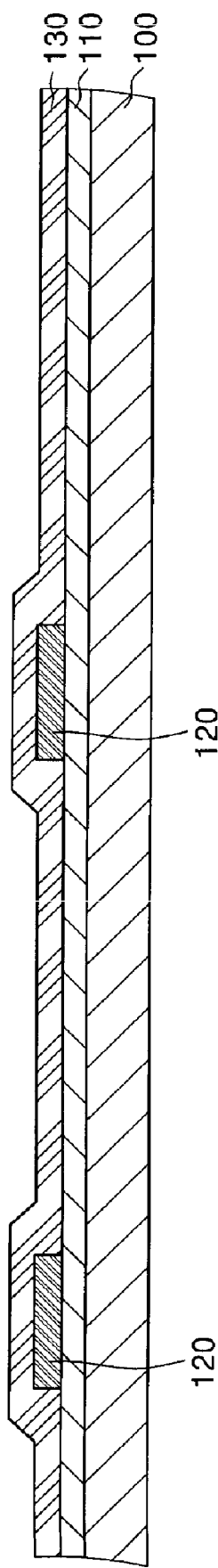

Reference will now be made in detail to aspects of the present invention, examples of which are illustrated in the accompanying drawings, wherein like reference numerals refer to the like elements throughout. The aspects are described below in order to explain the present invention by referring to the figures.

FIGS. 1A through 1E are cross-sectional views illustrating a method of fabricating an organic light emitting diode (OLED) display device according to an aspect of the present invention. Referring to FIG. 1A, a buffer layer 110 is formed on a substrate 100. The buffer layer 110 may be a silicon oxide layer, a silicon nitride layer, or a stacked layer thereof. Thereafter, a semiconductor layer 120 is formed on the buffer layer 110, and a gate insulating layer 130 is formed on the entire surface of the substrate having the semiconductor layer 120. The semiconductor layer 120 is formed of polycrystalline silicon (poly-Si), but is not restricted thereto.

Figure 1B:
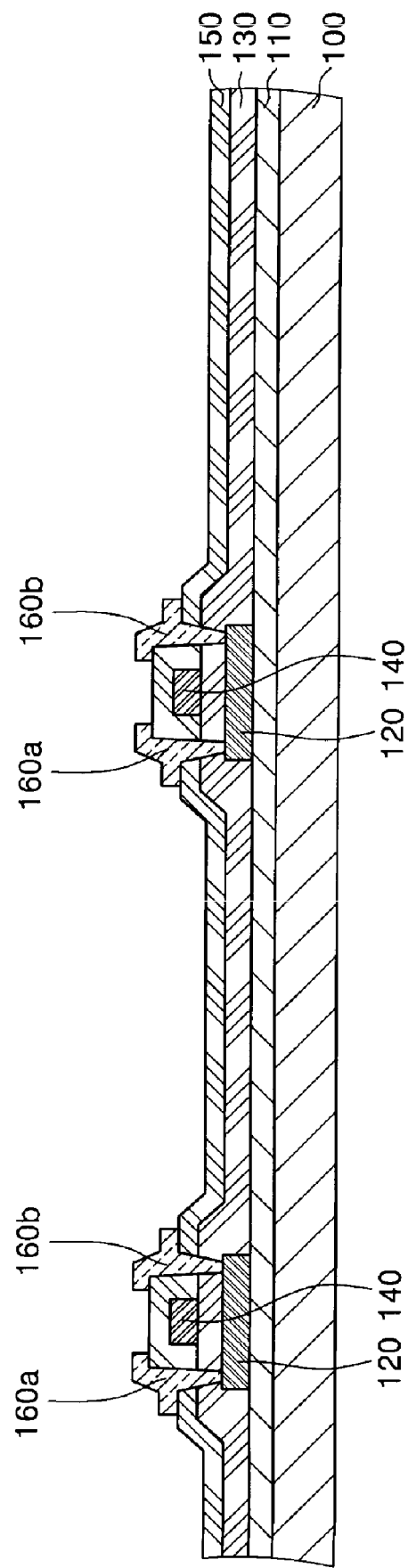

Referring to FIG. 1B, a gate electrode 140, an interlayer insulating layer 150, and source and drain electrodes 160a and 160b are formed on the gate insulating layer 130 to constitute a thin film transistor (TFT). In this case, the gate electrode 140, the source and drain electrodes 160a and 160b, or all of the electrodes 140, 160a and 160b may be formed of an organic carbide and a metal nanoparticle. The metal nanoparticle may be nanoparticles of gold (Au), silver (Ag), and/or nickel (Ni), for example, having low resistivity, and the organic carbide may be carbon black. Also, interconnections (not shown), which are connected to the gate electrode 140 or the source and drain electrodes 160a and 160b, may be formed of an organic carbide and a metal nanoparticle like the organic carbide and the metal nanoparticle in the gate electrode 140 or the source and drain electrodes 160a and 160b.

When the interconnections are formed of the same organic carbide and the metal nanoparticle, the Au, Ag, and/or Ni nanoparticles have low resistivity and good electrical conductivity, while the organic carbide, such as carbon black, has electric conductivity. Therefore, when the interconnections are formed of the nanoparticles of Au, Ag, and/or Ni and the organic carbide, the interconnections can also have good electrical conductivity.

A more detailed method of forming the gate electrode 140, the source and drain electrodes 160a and 160b, and the interconnections will be described later with reference to FIGS. 2A through 2C. In aspects of the present invention, each of the gate insulating layer 140 and the interlayer insulating layer 150 may be one of a silicon oxide layer, a silicon nitride layer, and a stacked layer thereof. Accordingly, a thin film transistor (TFT) is completed or formed by performing the above-described process.

Figure 1C:
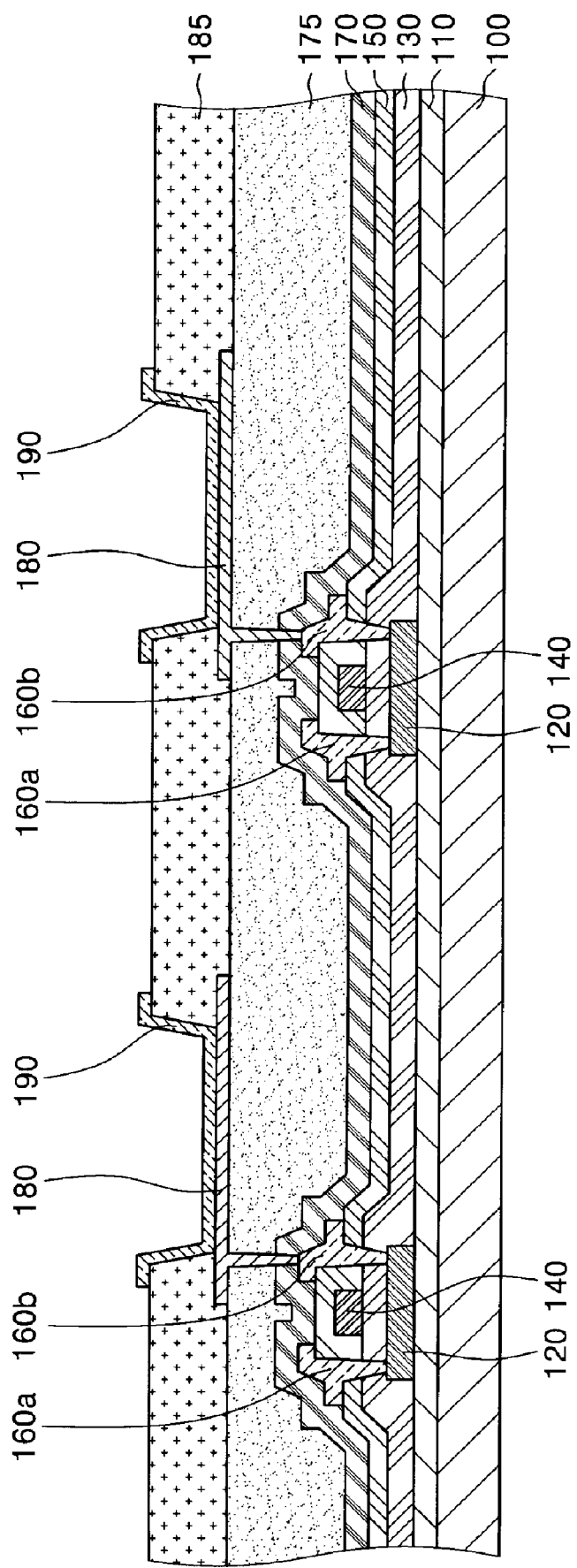

Thereafter, referring to FIG. 1C, a passivation layer 170 and a planarization layer 175 are sequentially formed on or over an entire surface of the substrate 100, and a first electrode 180 is formed on the planarization layer 175 such that the first electrode 180 is electrically connected to the source or drain electrodes 160a and 160b by way of a via hole (not shown) formed through the passivation layer 170 and the planarization layer 175. A pixel defining layer 185 is then formed on or over the planarization layer 175 and/or a portion of the first electrode 180 to partially expose (or to expose a portion of) the first electrode 180. Accordingly, a pixel is defined, and an organic emission layer 190 is formed on the exposed first electrode 180 or the exposed portion thereof.

Figure 1D:
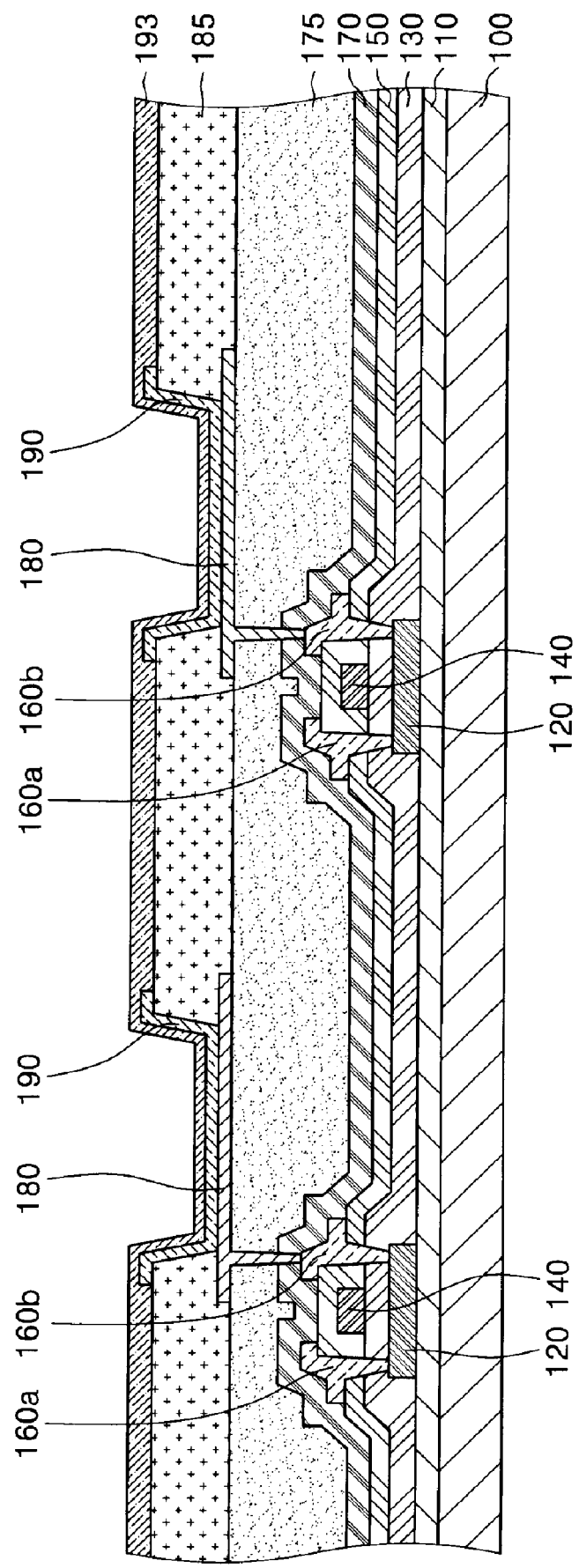

Referring to FIG. 1D, a second electrode 193 is formed on or over the entire surface of the substrate 100 having the organic emission layer 190, thereby completing an OLED display device. In the OLED display device, the first electrode 180 and/or the second electrode 193 also may be formed of an organic carbide and a metal nanoparticle like the organic carbide and the metal nanoparticle in the gate electrode 140 and the source and drain electrodes 160a and 160b. Also, interconnections (not shown), which are connected to the first and second electrodes 180 and 193, may be formed of an organic carbide and a metal nanoparticle like the organic carbide and the metal nanoparticle in the first electrode 180 or the second electrode 193.

After the OLED display device is completed or formed as described above, an interconnection (not shown), which is connected to the second electrode 193, may be formed in order to prevent or reduce an IR (or voltage) drop from occurring in the second electrode 193.

Referring to FIG. 1E, an electrode bus line 198 (corresponding to the second electrode 193) may be patterned in a non-pixel region of the pixel defining layer 185. The electrode bus line 198 (referred to as a second electrode bus line) may be connected to the second electrode 193, functions to prevent an IR (or voltage) drop in the second electrode 193, and may be formed of the same material as the second electrode 193. In aspects of the present invention, the non-pixel region refers to a region of the pixel defining layer 185 that does not overlap with the first electrode 180, for example.

In other words, the second electrode bus line 198 also may be formed of the organic carbide and the metal nanoparticle as discussed above. The organic carbide is fine black carbon powder (e.g., soot). Since the organic carbide has conductivity, it is also used in batteries in other situations, and has a light absorption effect.

Hereinafter, a method of forming electrodes and interconnections of an organic light emitting diode (OLED) display device according to an aspect of the present invention will be described with reference to FIGS. 2A through 2C. FIGS. 2A through 2C are cross-sectional views illustrating a method of forming electrodes and interconnections of an organic light emitting diode (OLED) display device according to an aspect of the present invention.

Figure 2A:
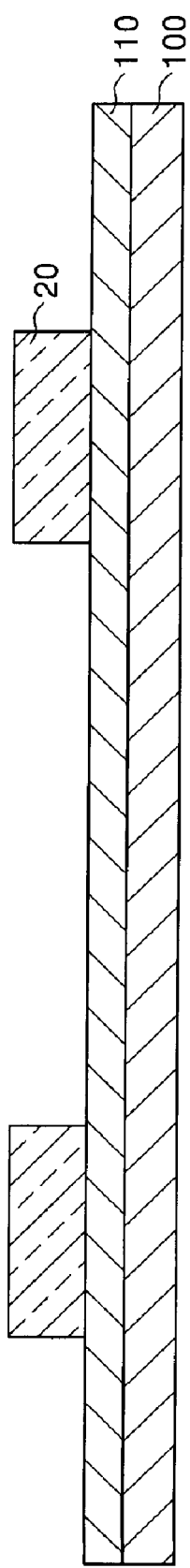
FIGS. 2A through 2C are cross-sectional views illustrating a method of forming electrodes and interconnections of an organic light emitting diode (OLED) display device according to aspect of the present invention.

Referring to FIG. 2A, a substrate 100 is provided. A buffer layer 110 is then formed on the substrate 100, and a metal mixed liquid (such as a slurry) is prepared by mixing a metal nanoparticle with an organic material in a liquid. The metal nanoparticle may be one of Au, Ag, and Ni nanoparticles, and the organic material may be a photoresist. In this case, the metal nanoparticle may be mixed with the organic material in a mixture ratio of 1:1 to 99:1.

When the electrodes and the interconnections are formed of a mixed material of the metal nanoparticle and the organic material, the mixture ratio of the metal nanoparticle to the organic material may be 1:1 or more so that the mixed material contains a greater amount of the metal nanoparticles than the organic material in order for the electrodes and the interconnections to have good electrical conductivity. Also, since the organic material is used to coat the metal nanoparticles, the mixture ratio of the metal nanoparticle to the organic material may be 99:1 or less.

The metal mixed liquid may be a suspension of the metal nanoparticles in a liquid solvent, and the metal nanoparticles, each of which is coated with a thin polymer layer, are isolated from one another thereby. The thin polymer layer prevents interactions among the metal nanoparticles to keep the suspension intact.

The organic material is a photoresist, which may be a polyphenoxide-based material or a polyphenol-based material that can be effectively carbonized due to the many benzene rings thereof. Alternatively, a polymer material, such as Poly(3,4-ethylenedioxythiophene) (PEDOT) or polyaniline (PANI), may be used as the organic material.

The metal mixed liquid may be coated on the substrate 100 using an inkjet printing technique or a spin coating technique, and patterned to form a pattern 20. Alternatively, the metal mixed liquid may be formed on the substrate 100 using a laser induced thermal imaging (LITI) technique.

Figure 2B:
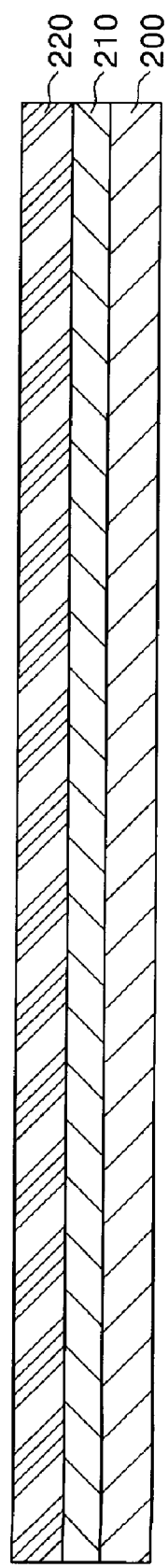

FIG. 2B is a cross-sectional view of a donor substrate 200 for the LITI technique. Referring to FIG. 2B, a light-to-heat conversion (LHC) layer 210 for converting a laser beam into heat is formed on the donor substrate 200. Also, a transfer layer 220 is formed on the LHC layer 210. Here, the transfer layer 220 may be formed of the metal mixed liquid.

Figure 2C:
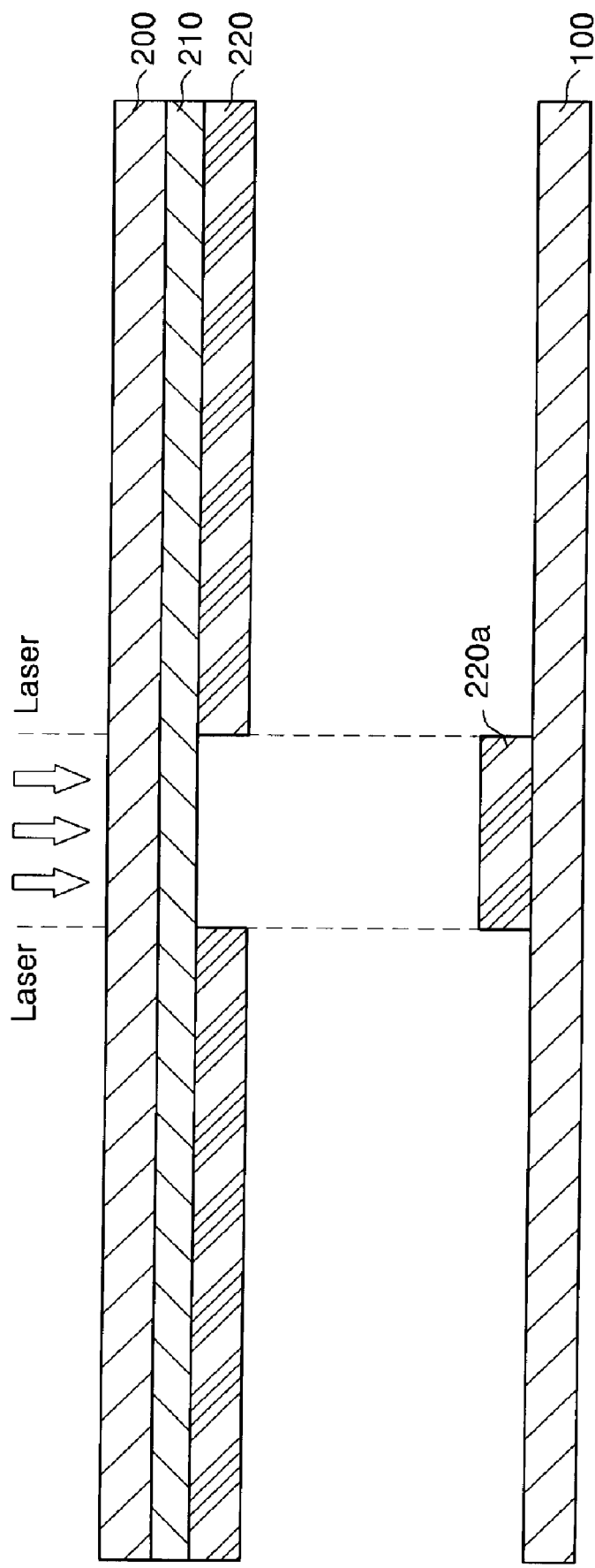

Referring to FIG. 2C, the donor substrate 200, having the transfer layer 220 formed of the metal mixed liquid, is located over the substrate 100. Thereafter, the transfer layer 220, formed of the metal mixed liquid, is simply transferred onto the substrate 100 using the LITI process or technique to form a metal mixed liquid pattern 220a.

The substrate 100 on which the metal mixed liquid pattern 220a is formed as described above, and may be sintered using an infrared (IR) laser in order to remove the organic material therefrom. In this process, the organic material is carbonized to generate carbon black, and the carbon black and the metal nanoparticles are fused to form interconnections thereon. The carbon black is fine black carbon powder (e.g., soot). Since the carbon black has conductivity or is conductive, it is also used for batteries in other situations.

Also, although the organic material is carbonized to a different degree according to the type of the organic material, it is necessary to use an infrared (IR) laser having at least an intensity of 1 J/cm$^2$ or higher to carbonize the organic material. Therefore, the degree of carbonization is controlled by selecting the type of the organic material so that carbon black with low electric resistivity can be selectively formed, thereby improving the characteristics of an OLED display device.

Also, the foregoing interconnections formed by fusing the metal nanoparticles and the carbon black reinforce adhesion of the substrate 100 with the metal nanoparticles, thereby preventing separation of the metal nanoparticles from the substrate 100.

In the above-described manner, not only the electrodes but also the interconnections, such as a gate line and a cathode bus line, can be prepared for the OLED display device using the mixture of the metal nanoparticles and the organic material.

As described above, aspects of the present invention provide an OLED display device, a method of fabricating the OLED display device, and a donor substrate for LITI. According to aspects of the present invention, interconnections are formed of metal nanoparticles and black carbon, so that an IR (or voltage) drop can be reduced, pixel failures can be reduced, and the characteristics of the OLED display device can be improved using a simple process.

In aspects of the present invention, nanoparticles may refer to small particles having three dimensional lengths of 10-100 nanometers each. Nanoparticles may also be crystalline, amorphous, or a mixture thereof, and may also be referred to as nanopowders or nanoclusters. Also, the nanoparticles of a material have size-dependent properties that are different from the properties of the larger sized bulk material or properties of the smaller molecular-sized material.

In various aspects, at least one of and and/or refer to alternatives chosen from available elements so as to include one or more of the elements. For example, if the elements available include elements X, Y, and Z, at least one of and and/or refer to X, Y, Z, or any combination thereof.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A thin film transistor (TFT) comprising:
   a substrate;
   a buffer layer disposed on the substrate;
   a semiconductor layer disposed on the buffer layer;
   a gate electrode disposed over the semiconductor layer;
   a gate insulating layer formed between the gate electrode and the semiconductor layer to electrically insulate the semiconductor layer from the gate electrode;
   source and drain electrodes electrically connected to the semiconductor layer; and
   an interlayer insulating layer formed between the gate electrode and the source and drain electrodes to electrically insulate the gate electrode from the source and drain electrodes, wherein the gate electrode and/or each of the source and drain electrodes is comprised of carbon black and a metal nanoparticle.

2. The TFT according to claim 1, wherein the metal nanoparticle is one selected from the group consisting of Au, Ag, and Ni nanoparticles.

3. The TFT according to claim 1, wherein the gate electrode and/or each of the source and drain electrodes is comprised of the carbon black and the metal nanoparticle being fused together.

4. An organic light emitting diode (OLED) display device comprising:
   a substrate;
   a buffer layer disposed on the substrate;
   a semiconductor layer disposed on the buffer layer;
   a gate electrode disposed over the semiconductor layer and electrically insulated from the semiconductor layer;
   a gate insulating layer formed between the gate electrode and the semiconductor layer to electrically insulate the semiconductor layer from the gate electrode;
   source and drain electrodes electrically insulated from the gate electrode and connected to the semiconductor layer;

an interlayer insulating layer formed between the gate electrode and the source and drain electrodes to electrically insulate the gate electrode from the source and drain electrodes;
a passivation layer disposed on an entire surface of the substrate;
a planarization layer disposed on the passivation layer;
a first electrode disposed on the planarization layer and connected to the source or drain electrodes;
a pixel defining layer disposed on the first electrode and exposing a portion of the first electrode;
an organic emission layer disposed in a pixel region on the exposed portion of the first electrode; and
a second electrode disposed over the entire surface of the substrate, wherein the gate electrode, the source and drain electrodes, the first electrode, and/or the second electrode are comprised of carbon black and a metal nanoparticle.

5. The OLED display device according to claim 4, further comprising a second electrode bus line.

6. The OLED display device according to claim 5, wherein the second electrode bus line is comprised of the carbon black and the metal nanoparticle.

7. The OLED display device according to claim 4, wherein the metal nanoparticle is one selected from the group consisting of Au, Ag, and Ni nanoparticles.

8. The OLED display device according to claim 4, wherein the gate electrode, the source and drain electrodes, the first electrode, and/or the second electrode are comprised of the carbon black and the metal nanoparticle being fused together.

9. The TFT of claim 1, the gate electrode and/or each of the source and drain electrodes being produced by a process comprising sintering an organic material and the metal nanoparticle to produce the carbon black and the metal nanoparticle.

10. The TFT of claim 9, the organic material and the metal nanoparticle prior to sintering being a dispersion of the metal nanoparticle in the organic material in a ratio of 1:1 to 99:1.

11. The OLED of claim 4, the gate electrode, the source and drain electrodes, the first electrode, and/or the second electrode are produced by a process comprising sintering an organic material and the metal nanoparticle to produce the carbon black and the metal nanoparticle.

* * * * *